(12) United States Patent
Kukushkin

(10) Patent No.: US 11,040,326 B2
(45) Date of Patent: Jun. 22, 2021

(54) METHOD FOR TREATING LIQUIDS WITH ALTERNATING ELECTROMAGNETIC FIELD

(71) Applicant: Vladimir Yurievich Kukushkin, Semibratovo (RU)

(72) Inventor: Vladimir Yurievich Kukushkin, Semibratovo (RU)

(73) Assignee: Vladimir Yurievich KUKUSHKIN, Semibratovo (RU)

( * ) Notice: Subject to any disclaimer, the term of this patent is extended or adjusted under 35 U.S.C. 154(b) by 0 days.

(21) Appl. No.: 16/670,652

(22) Filed: Oct. 31, 2019

(65) Prior Publication Data

US 2020/0164336 A1    May 28, 2020

(30) Foreign Application Priority Data

Nov. 22, 2018   (EP) ..................... 18207702

(51) Int. Cl.
| | | |
|---|---|---|
| *B01J 19/08* | (2006.01) | |
| *H03K 5/003* | (2006.01) | |
| *C02F 1/48* | (2006.01) | |

(52) U.S. Cl.
CPC ............ *B01J 19/087* (2013.01); *H03K 5/003* (2013.01); *B01J 2219/0877* (2013.01); *C02F 1/48* (2013.01); *C02F 2201/4617* (2013.01); *C02F 2201/46175* (2013.01)

(58) Field of Classification Search
CPC .... B01J 19/087; B01J 2219/0877; C02F 1/48; C02F 1/487; C02F 2201/46175
See application file for complete search history.

(56) References Cited

U.S. PATENT DOCUMENTS

| 4,328,525 | A | * | 5/1982 | Allen .................. | G11C 19/085 |
| | | | | | 331/117 R |
| 5,460,144 | A | * | 10/1995 | Park .................... | F02M 27/045 |
| | | | | | 123/538 |
| 2002/0152674 | A1 | | 10/2002 | Prevost | |
| 2005/0149169 | A1 | | 7/2005 | Wang et al. | |

(Continued)

FOREIGN PATENT DOCUMENTS

| CN | 107166423 A | * | 9/2017 |
| CN | 108735421 A | * | 11/2018 |

(Continued)

OTHER PUBLICATIONS

Yao et al—CN 107166423 A Machine Translation—2017 (Year: 2017).*

(Continued)

*Primary Examiner* — Bradley R Spies
(74) *Attorney, Agent, or Firm* — Sughrue Mion, PLLC; Richard C. Turner; Marina Zalevsky

(57) ABSTRACT

A method of processing a liquid by an alternating electromagnetic field includes: generating DC pulses by a pulse generator; and applying the DC pulses to a parallel oscillating circuit connected in parallel to the pulse generator. The parallel oscillating circuit includes an inductor connected in parallel to a capacitor. In response to the DC pulses, self-oscillations arise in the parallel oscillating circuit, the self-oscillations producing an alternating current in the inductor; and the inductor generates the alternating electromagnetic field for processing the liquid.

4 Claims, 1 Drawing Sheet

(56) References Cited

U.S. PATENT DOCUMENTS

2011/0253542 A1   10/2011  Zanzucchi
2018/0010305 A1    1/2018  Bentaj et al.

FOREIGN PATENT DOCUMENTS

| RU | 2091324 C1 | 9/1997 |
|---|---|---|
| RU | 2179572 C1 | 2/2002 |
| RU | 2444864 C2 | 3/2012 |
| RU | 2524718 | 8/2014 |
| RU | 2545278 C2 | 3/2015 |
| RU | 2546886 | 4/2015 |
| RU | 2562505 C2 | 9/2015 |
| RU | 163728 U1 | 8/2016 |
| RU | 170891 U1 | 5/2017 |
| RU | 2016101620 A | 7/2017 |
| WO | 2016/128554 A1 | 8/2016 |
| WO | 2016175683 A2 | 11/2016 |
| WO | 2017/126988 A1 | 7/2017 |

OTHER PUBLICATIONS

Luo et al—CN 108735421 A Machine Translation—2018 (Year: 2018).*
Volodina et al—RU 2546886 C1 Machine Translation—2015 (Year: 2015).*
Communication dated Jun. 14, 2019 in counterpart Russian Application No. 2018143454/05.
Communication dated May 15, 2019 issued by European Patent Office in counterpart European Application No. 18207702.4, total of 6 pages.

* cited by examiner

METHOD FOR TREATING LIQUIDS WITH ALTERNATING ELECTROMAGNETIC FIELD

CROSS-REFERENCE TO RELATED APPLICATION

This application is based on and claims priority under 35 U.S.C. § 119 to European Patent Application No. 18207702.4 filed on Nov. 22, 2018, the disclosure of which is incorporated by reference herein in its entirety.

BACKGROUND

Field

Embodiments relate to treatment of liquids by the alternating electromagnetic field, specifically, to the treatment of the hydrocarbon fuels, water and water solutions, alcohol solutions, wine, wine materials, biological liquids, and other materials being under certain conditions in the liquid state. The apparatuses and methods according to embodiments may be used in industry, power system, utilities, agricultural area, medicine, housekeeping, transport and other fields requiring treatment of liquids.

Related Art

Russian patent publication No. RU 2546886 discloses a device for magnetoacoustic treatment of liquid hydrocarbon fuel, containing the housing, inlet and outlet fuel nozzles, AC inductor, and also an internal cylindrical chamber from non-conducting material for fuel passing connected with inlet and outlet nozzles is offered. Inside the chamber coaxially with it a thin-walled metal tube is installed, and at distances from the ends of the metal tube the permanent magnets designed as disks and facing to each other with unlike poles are located. This device uses the alternating electrical current generating the alternating electromagnetic fields in the inductor; the alternating electric field has a frequency of the supply current.

Russian patent publication No. RU 2524718 discloses a device for electromagnetic treatment of water and fluids. The device includes inductors arranged around pipeline and made of diamagnetic material and connected to electromagnetic pulse generators. Every inductor is composed of turns of electrically isolated wire. Electronic control unit includes two galvanically isolated four-channel electromagnetic pulse generators to generate forward and reverse signals. One end of wire of every inductor is connected to one output of every the generator. Second end of wire of every inductor is connected to appropriate outlet of another generator of electromagnetic pulses. In this device, the inductors are connected to the DC pulse generators producing alternating electromagnetic field. The generators generate direct and inverted signals changing the DC polarity at the inductors outputs.

Russian patent publication No. RU 2179572 C1 discloses a device for electromagnetic treatment of liquid petroleum products. Method consists in that liquid hydrocarbons are preheated to turn into vapor state and resulting vapors, which are made to move spirally inside a container, are treated by unipolar electromagnetic pulses with power greater than 1 MW, duration less than 1 ns, and frequency at least 1 kHz, after which vapors are cooled to a liquid state in an apparatus for processing the liquid hydrocarbons that includes a tank for processing hydrocarbons and a system for supplying and removing them and an exciter of electromagnetic pulses associated with the tank for processing.

SUMMARY

A method of processing a liquid by an alternating electromagnetic field includes: generating DC pulses by a pulse generator; and applying the DC pulses to a parallel oscillating circuit connected to the pulse generator. The parallel oscillating circuit includes an inductor connected in parallel to a capacitor. In response to the DC pulses, self-oscillations arise in the parallel oscillating circuit, the self-oscillations producing an alternating current in the inductor; and the inductor generates the alternating electromagnetic field for processing the liquid.

DESCRIPTION

Figure 1:
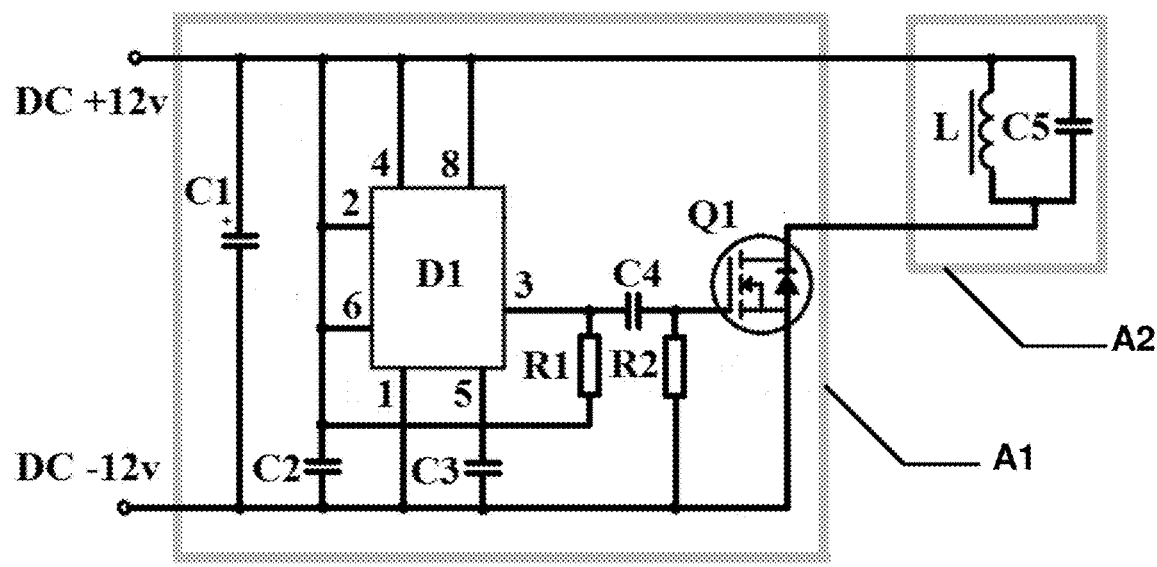
FIG. 1 schematically shows representative component parts of an apparatus, according to an embodiment.
Figure 2:
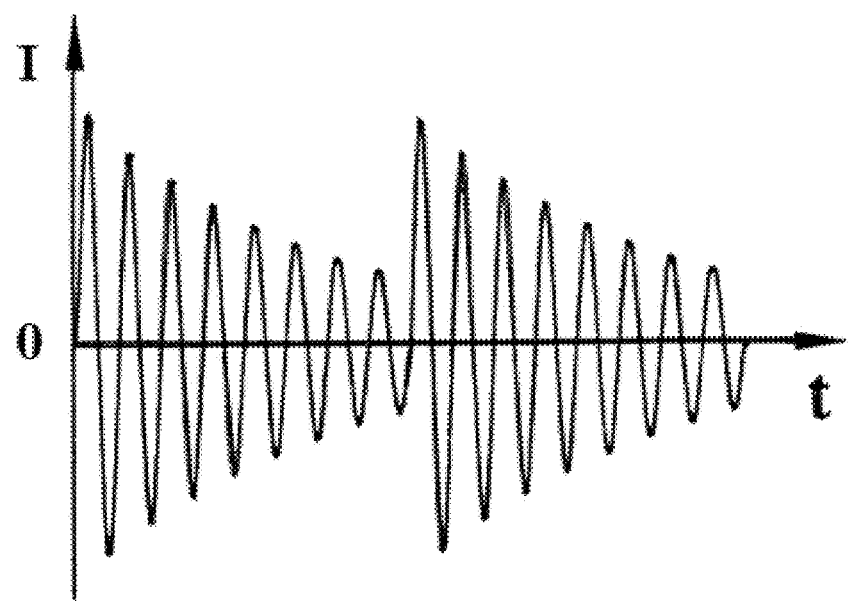
FIG. 2 illustrates a self-oscillation process in a parallel oscillating circuit when exposed to DC pulses from a pulse generator according to an embodiment.

Embodiments provide for processing of liquids with an alternating electromagnetic field in order to change physical properties and improve consumer quality of the liquids. The technical solution is to use a device including of a pulse generator A1, e.g., a DC pulse generator, and a parallel oscillating circuit A2 connected to the DC pulse generator and including an inductor L having an inductance, and a capacitor C5 having a capacitance (FIG. 1). When a parallel oscillating circuit A2 is subjected to the DC pulses from a pulse generator A1, the inductor L of the parallel oscillating circuit A2 generates an alternating electromagnetic field which is used for processing of liquids. When exposed to each DC pulse from a pulse generator A1, the inductor L of a parallel oscillating circuit A2 accumulates energy, which, after the end of the impact of the DC pulse, is transmitted to capacitor C5. As a result, reactive energy arises, which circulates inside the parallel oscillating circuit A2: in one part of the period the energy of the magnetic field of the inductor L is converted into the energy of the electric field of the capacitor C5, in the other part of the period the reverse occurs. In parallel oscillating circuit A2 arise self-oscillations, which produce alternating current in an inductor L, and, as a result, the inductor L generates an alternating electromagnetic field. Due to the internal resistance of the circuit of the parallel oscillating circuit A2, the self-oscillation amplitude decreases in time in each period. Next, the next DC pulse comes from the pulse generator A1, and the process repeats, as shown in FIG. 2. As a result of the self-oscillation in a parallel oscillating circuit A2, the generating of an alternating electromagnetic field by the inductor L continues without the application of external energy, by using the energy accumulated in the parallel oscillating circuit A2. The frequency of self-oscillations of a parallel oscillating circuit A2 depends on the parameters of the components of its inductance and capacitance. The frequency of the pulse generator A1 does not depend on the frequency of self-oscillations in the parallel oscillating circuit A2. For maximum processing efficiency of liquids, the frequency of the pulse generator A1 is chosen such that the next DC pulse acts on the parallel oscillating circuit A2 before the end of its self-oscillations in the previous period.

For exposure of alternating electromagnetic field directly on liquids, the inductor L of the parallel oscillating circuit A2 may be immersed in them. The inductor L, capacitor C5 of the parallel oscillating circuit A2 and the pulse generator A1 are connected in an electrical circuit. When it is difficult to become immersed in liquids, the inductor L of the parallel oscillating circuit may be placed directly on the external wall(s) of pipeline(s) and/or tank(s) made of dielectric materials. The inductor L and the capacitor C5 of the parallel oscillating circuit A2 and the pulse generator A1 are located both in one body, e.g., a housing, and separated into two circuits which are electrically interconnected.

The embodiments differ from the related art by using a device capable of generating an alternating electromagnetic field resulting from self-oscillations in the parallel oscillating circuit A2 by application of the DC pulses from the pulse generator A1.

As a result of an application of the method according to an embodiment, the liquid(s) show an enhanced fluidity. The conclusion about the enhanced fluidity of water processed according to the method of an embodiment is based on the results of the carried out experiment. At production of two identical samples, the concrete was used identical of the cement-sand mix and water from one source. The unprocessed water and water processed by the exemplary method was added to the first and second mix accordingly. To obtain the same viscosity of concrete samples, the water treated by the exemplary method required 15% less volume. The conclusion about the enhanced fluidity of the petrol is based on the results of the experiment with a car with a gasoline-powered internal combustion engine. The initial vehicle engine power characteristics were recorded by chassis dynamometer system. Gasoline was processed using a device that is used in the inventive method and was installed on the outer wall of the fuel hose laid to the car engine. After 1000 km logged, the control characteristics were recorded by the chassis dynamometer system. At the engine rpm speed in the range of 1500-2500 rpm, the 15-20% power ascension about initial characteristics was detected. At the engine rpm speed in the range of 2500-5000 rpm, the 8-10% power ascension about initial characteristics was detected. Based on the results, it was concluded, that after the processing via the exemplary method the petrol gains the enhanced fluidity, much better dissipates and combusts more completely in a compression chamber therefore enhancing the horsepower of the internal combustion engine.

As described above, the device for processing of liquids with an alternating electromagnetic field is made of a pulse generator A1 connected to a parallel oscillating circuit A2. The parallel oscillating circuit A2 includes a capacitor C5, as a capacitance, and an inductor L, as an inductance. As an example, the pulse generator A1 may include a controller D1 type NE555. NE555 is an integrated circuit chip (IC chip) which can be used in different types of timers. For example, the pulse generator A1 further includes the following capacitors and resistors having exemplary values as follows:

a first capacitor C1—2200 μF×25V;
a second capacitor C2—0.1 μF;
a third capacitor C3—0.1 μF;
a fourth capacitor C4—0.1 μF; and
a first resistor R1—57 kΩ; and
a second resistor R2—1.5 kΩ.

The value of the capacitor C5 may be 4.7 μF. The pulse generator A1 further includes a transistor Q1, for example, a MOSFET IRF3205.

The pulse generator A1 may be a unipolar DC pulse generator with a low output resistance. The parallel oscillating circuit A2 is produced from the parallelly connected capacitor C5 and inductor L made of insulated wire. If the increase of the inductance value is required, an inductor L core may be used. In this case, the alternating electromagnetic field used for processing of the liquid is emitted from the poles of the core. At low natural frequency of the parallel oscillating circuit A2 fluctuations, a core is produced from low-coercivity materials such as iron. At high natural frequency of the parallel oscillating circuit A2 fluctuations, a core is produced from ferrite materials. The parallel oscillating circuit A2 and pulse generator A1 are parallely connected by the electric circuitry (FIG. 1). The pulse generator A1 is powered from an external power source, for example, a 12 VDC power source.

In an embodiment, the pulse generator A1 generates DC pulses based on a timer NE555. 100 Hz frequency is used, adjusted by a series circuit made of a second capacitor C2 and a first resistor R1. The duration of the DC pulses used is 0.12 ms, adjusted a series circuit made of a fourth capacitor C4 and a second resistor R2. The first capacitor C1 is a polar capacitor that accumulates energy between the DC pulses. A MOSFET is used as a transistor Q1 with a low resistance in the open position. The inductor L is wound on a round core made of iron (d=8 mm, l=30 mm) using insulated copper wire (d=0.5 mm) and contains, for example, about 50 turns. All elements are electrically connected as shown in FIG. 1. For the processing of the liquids, the alternating electromagnetic field emitted by one of the inductor L poles is applied.

The invention claimed is:

1. A method of processing a liquid by an alternating electromagnetic field, the method comprising:
   generating and outputting DC pulses by a pulse generator; and
   applying the DC pulses to a parallel oscillating circuit connected to the pulse generator,
   wherein a repetition rate of the DC pulses output by the pulse generator does not depend on a resonance frequency of the parallel oscillating circuit,
   the parallel oscillating circuit includes an inductor connected in parallel to a capacitor, and
   in response to the DC pulses:
      self-oscillations arise in the parallel oscillating circuit, the self-oscillations producing an alternating current in the inductor that has a frequency different from the repetition rate of the DC pulses output by the pulse generator, and
      the inductor generates the alternating electromagnetic field for processing the liquid.

2. The method of claim 1, wherein the liquid includes fuel.

3. An apparatus for processing a liquid by an alternating electromagnetic field, the apparatus comprising:
   a pulse generator configured to generate and output DC pulses; and
   a parallel oscillating circuit electrically connected to the pulse generator and configured to be subjected the DC pulses generated by the pulse generator,
   wherein a repetition rate of the DC pulses output by the pulse generator does not depend on a resonance frequency of the parallel oscillating circuit,
   wherein the parallel oscillating circuit comprises:
      a capacitor, and
      an inductor connected in parallel to the capacitor,
   wherein, in response to the DC pulses:
      self-oscillations arise in the parallel oscillating circuit, the self-oscillations producing an alternating current in the inductor that has a frequency different from the repetition rate of the DC pulses output by the pulse generator, and the inductor generates the alternating electromagnetic field for processing the liquid.

4. The apparatus of claim 3, wherein the liquid includes fuel.

\* \* \* \* \*